(12) United States Patent
Ishihara (10) Patent No.: US 11,690,207 B2
(45) Date of Patent: Jun. 27, 2023

(54) MAGNETIC SHIELD MATERIAL

(71) Applicant: Kitagawa Industries Co., Ltd., Inazawa (JP)

(72) Inventor: Taichi Ishihara, Kasugai (JP)

(73) Assignee: Kitagawa Industries Co., Ltd., Inazawa (JP)

( * ) Notice: Subject to any disclaimer, the term of this patent is extended or adjusted under 35 U.S.C. 154(b) by 0 days.

(21) Appl. No.: 17/294,873

(22) PCT Filed: Nov. 14, 2019

(86) PCT No.: PCT/JP2019/044731
§ 371 (c)(1),
(2) Date: May 18, 2021

(87) PCT Pub. No.: WO2020/105543
PCT Pub. Date: May 28, 2020

(65) Prior Publication Data
US 2022/0007555 A1    Jan. 6, 2022

(30) Foreign Application Priority Data

Nov. 19, 2018 (JP) ................................. 2018-216845

(51) Int. Cl.
*H05K 9/00* (2006.01)

(52) U.S. Cl.
CPC ......... *H05K 9/0084* (2013.01); *H05K 9/0075* (2013.01); *H05K 9/0058* (2013.01)

(58) Field of Classification Search
CPC ........................... H05K 9/0075; H05K 9/0088
See application file for complete search history.

(56) References Cited

U.S. PATENT DOCUMENTS

| | | | |
|---|---|---|---|
| 5,260,128 A | 11/1993 | Ishii et al. | |
| 6,225,556 B1 | 5/2001 | Saito | |

(Continued)

FOREIGN PATENT DOCUMENTS

| | | | |
|---|---|---|---|
| JP | 10-93284 A | 4/1998 | |
| JP | 2005-514797 A | 5/2005 | |

(Continued)

OTHER PUBLICATIONS

International Search Report (PCT/ISA/210) issued in PCT Application No. PCT/JP2019/044731 dated Feb. 4, 2020 with English translation (five (5) pages).

(Continued)

*Primary Examiner* — Hung V Ngo
(74) *Attorney, Agent, or Firm* — Crowell & Moring LLP (57) ABSTRACT

In a magnetic shield material including a magnetic layer containing a magnetic material and an electrically conductive layer containing an electrically conductive material, the electrically conductive layer is designed to have a thickness corresponding to a frequency band of electromagnetic wave to be shielded. More specifically, the thickness of the electrically conductive layer (thickness of the aluminum foil in the drawing) is designed to have a thickness to maximize magnetic field shield effect of the magnetic shield material (thickness of the aluminum foil corresponding to peak value frequency in curve E in the drawing) in a frequency band of electromagnetic wave to be shielded. This makes it possible to obtain good magnetic field shield effect of the magnetic shield material in the frequency band of electromagnetic wave to be shielded.

8 Claims, 6 Drawing Sheets

(56) References Cited

U.S. PATENT DOCUMENTS

| | | |
|---|---|---|
| 7,335,838 B2 | 2/2008 | Simola |
| 2005/0162249 A1* | 7/2005 | Simola ................. H05K 9/0001 |
| | | 335/301 |
| 2017/0090532 A1* | 3/2017 | Koukami ................ G06F 1/203 |

FOREIGN PATENT DOCUMENTS

| | | |
|---|---|---|
| JP | 2005-142551 A | 6/2005 |
| JP | 2018-67629 A | 4/2018 |

OTHER PUBLICATIONS

Japanese-language Written Opinion (PCT/ISA/237) issued in PCT Application No. PCT/JP2019/044731 dated Feb. 4, 2020 (three (3) pages).

\* cited by examiner

MAGNETIC SHIELD MATERIAL

TECHNICAL FIELD

The present invention relates to a magnetic shield material with magnetic field shield effect.

BACKGROUND ART

There has conventionally been an increase in devices to generate low-frequency electromagnetic waves (in particular, frequencies equal to or lower than 3 MHz). These devices include switching power supplies. The low-frequency electromagnetic waves (noise) generated from these devices influence, for example, a CMOS (Complementary MOS) in a digital camera, causing a problem that noise appears in captured images. Therefore, the need to shield low-frequency electromagnetic waves is increasing. Here, in order to shield the low-frequency electromagnetic waves, it is necessary to use a magnetic shield material with a significant magnetic field shield effect among electromagnetic wave shield materials.

The magnetic field shield effect using a magnetic shield material described above is generally determined by the relative permeability and the thickness of a high relative permeability material such as permalloy used as the magnetic shield material. However, high relative permeability materials such as permalloy used as conventional magnetic shield materials are expensive because they are required to be heat treated at the time of manufacturing and they contain Ni. Thus, as disclosed in Patent Document 1, there is a magnetic shield material enhanced in the magnetic field shield effect relatively inexpensively by stacking a magnetic layer containing a (soft) magnetic material and an electrically conductive layer containing an electrically conductive material (material with a low electrical resistivity).

PRIOR ART DOCUMENTS

Patent Documents

[Patent Document 1] Japanese Laid-open Patent Publication 2018-67629

SUMMARY OF THE INVENTION

Problem to be Solved by the Invention

However, such conventional magnetic shield material formed by simply stacking a magnetic layer containing a magnetic material and an electrically conductive layer containing an electrically conductive material as described in the above Patent Document 1 cannot always have a significant magnetic field shield effect in the frequency band of the electromagnetic wave to be shielded (electromagnetic wave generated from a device around the magnetic shield material).

An object of the present invention is to solve the problems described above and to provide a magnetic shield material which can have a good magnetic field shield effect in a frequency band of the electromagnetic wave to be shielded.

Means to Solve the Problem

In order to solve the above problem, a magnetic shield material of the present invention comprises: a magnetic layer containing a magnetic material; and an electrically conductive layer containing an electrically conductive material, wherein the electrically conductive layer has a thickness corresponding to a frequency band of electromagnetic wave to be shielded.

In this magnetic shield material, it is preferred that the thickness of the electrically conductive layer is a thickness to maximize magnetic field shield effect of the magnetic shield material in the frequency band of electromagnetic wave to be shielded.

In this magnetic shield material, it is preferred that the electrically conductive material is aluminum.

In this magnetic shield material, the electrically conductive layer can be a sheet metal including a metal foil.

In this magnetic shield material, it is preferred that the magnetic material is a soft magnetic material.

In this magnetic shield material, it is preferred that the magnetic material is an amorphous metal.

In this magnetic shield material, it is preferred that the magnetic layer is a sheet metal including a metal foil.

Effects of the Invention

According to the present invention, the electrically conductive layer is designed to have a thickness corresponding to the frequency band of electromagnetic wave to be shielded. Here, in a magnetic shield material, like the magnetic shield material of the present invention, which comprises the magnetic layer containing a magnetic material and the electrically conductive layer containing an electrically conductive material, the thickness of the electrically conductive layer to maximize the magnetic field shield effect differs depending on the frequency band of electromagnetic wave to be shielded. Thus, as described above, by designing the electrically conductive layer to have a thickness corresponding to the frequency band of electromagnetic wave to be shielded (by changing the thickness of the electrically conductive layer depending on the frequency band of electromagnetic wave to be shielded), it becomes possible to obtain good magnetic field shield effect in the frequency band of electromagnetic wave to be shielded.

DESCRIPTION OF EMBODIMENTS

Hereinafter, a magnetic shield material according to an exemplary embodiment of the present invention will be described with reference to the drawings.

(Structure and Material of Magnetic Shield Material)

Figure 1:
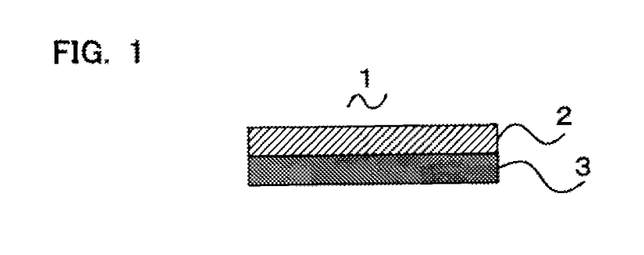
FIG. 1 Cross-sectional view of a magnetic shield material according to an embodiment of the present invention.

FIG. 1 is a cross-sectional view of a magnetic shield material according to the present embodiment. As shown in FIG. 1, the magnetic shield material 1 comprises a magnetic layer 2 containing a magnetic material, and an electrically conductive layer 3 containing an electrically conductive material. More specifically, the magnetic shield material 1 is formed by stacking the magnetic layer 2 containing the magnetic material and the electrically conductive layer 3 containing the electrically conductive material. In this magnetic shield material 1, the electrically conductive layer 3 has a thickness corresponding to a frequency band of an electromagnetic wave to be shielded (electromagnetic wave generated from a device around the magnetic shield material). According to the present embodiment, the thickness of the electrically conductive layer 3 is set to be one which maximizes the magnetic field shield effect of the magnetic shield material 1 in the frequency band of the electromagnetic wave to be shielded.

Materials which can be used for the magnetic layer 2 described above are: a sheet metal of a high relative permeability metal such as permalloy, silicon steel, iron, stainless steel, sendust or the like which is formed into a sheet shape; a metal foil of an amorphous metal; a ferrite material sintered into a sheet form; and a sheet of each of the magnetic materials described above (the high relative permeability metal such as permalloy, silicon steel, iron and stainless steel, the amorphous metal, and the ferrite material) made by powdering and compounding (mixing) each into resin, rubber or the like. Note that each magnetic material used for the magnetic layer 2 is basically a soft magnetic material. This is because, generally, the soft magnetic material has properties of low coercive force and high relative permeability. Note that in the measurement of magnetic field shield effect described later, a metal foil of a nanocrystalline soft magnetic material produced by crystallizing an amorphous alloy was used for the magnetic layer 2.

Further, materials which can be used for the electrically conductive layer 3 described above are: a sheet metal of an electrically conductive metal (with low electrical resistivity) such as copper, gold, silver, nickel, aluminum or the like which is formed into a sheet shape; a deposition of each of the electrically conductive metals described above which is made by depositing each on a film, a cloth or the like by a method such as plating, sputtering, vapor deposition or the like so that the (deposition) surface can be used for electrical conduction (current can flow on the surface); and a sheet of each of the electrically conductive metals described above made by powdering and compounding (mixing) each into resin, rubber or the like. Note that in the measurement of magnetic field shield effect described later, an aluminum foil was used for the electrically conductive layer 3.

(Example of Method of Using Magnetic Shield Material)

Figure 2:
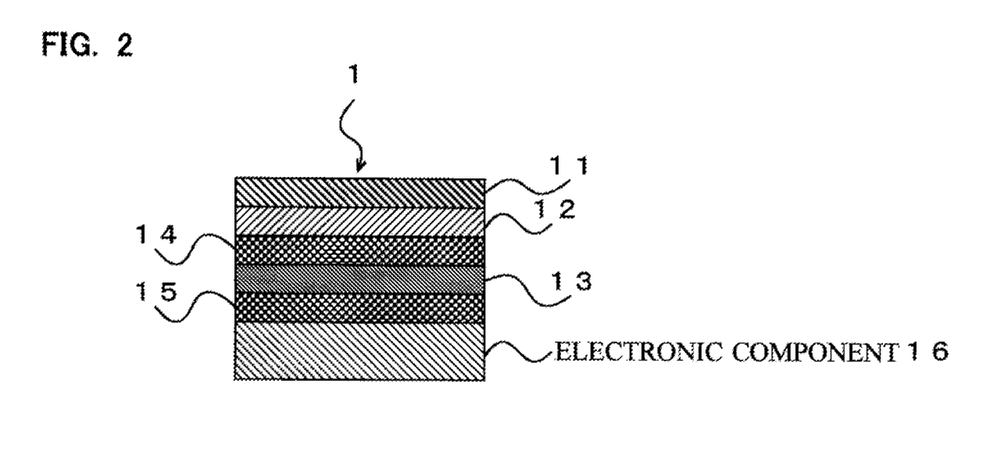
FIG. 2 Cross-sectional view of materials and component around the magnetic shield material as an example of using it.

Next, referring to FIG. 2, an example of a method of using the magnetic shield material 1 of the present embodiment will be described. In the example of FIG. 2, a magnetic foil 12 which is a metal foil of a Fe-based nanocrystalline soft magnetic material is used for the magnetic layer of the magnetic shield material 1, while an aluminum foil 13 which is a metal foil of aluminum is used for the electrically conductive layer. In this example, the magnetic shield material 1 comprises a layer of PET (polyethylene terephthalate) film 11 and layers of double-sided adhesive tapes 14, 15 in addition to the layers of magnetic foil 12 and aluminum foil 13 described above. The lower surface of the PET film 11 is adhered to the upper surface of the magnetic foil 12 by an acrylic resin-based adhesive. The reason for providing the layer of PET film 11 on the uppermost layer of magnetic shield material 1 is to protect the surface of the magnetic shield material 1, and to increase heat resistance of the magnetic shield material 1. Further, the upper and lower surfaces of the double-sided adhesive tape 14 are attached to the lower surface of the magnetic foil 12 and the upper surface of the aluminum foil 13, respectively, while the upper and lower surfaces of the double-sided adhesive tape 15 are respectively attached to the lower surface of the aluminum foil 13 and the upper surface of the electronic component 16 which acts as an electromagnetic wave (noise) generation source. The electronic component 16 includes, of course, a circuit such as an IC as well as a switching power supply.

(Measurement of Magnetic Field Shield Effect)

Next, referring to FIG. 3, measurement results of the magnetic field shield effect of the magnetic shield material 1 with a structure shown in FIG. 2 above will be described. In this measurement, the magnetic field shield effect of the magnetic shield material 1 was measured by KEC method. The KEC method is a measurement method developed by KEC (Kansai Electronic Industry Development Center). According to the measurement system of the KEC method, attenuation of the intensity of magnetic field or electric field of near field in the presence of a shield material as seen from the intensity of magnetic field or electric field of near field (region near magnetic wave generation source) in the absence of the shield material is measured as shield effect in decibels. Here, the shield effect (SE) is obtained by the following equation (1).

$$SE\ (dB) = 20\ \log_{10}(E_0/E_1) \tag{1}$$

(where $E_0$: magnetic field intensity or electric field intensity of near field in the absence of shield material, $E_1$: magnetic field intensity or electric field intensity of near field in the presence of shield material).

Figure 3:
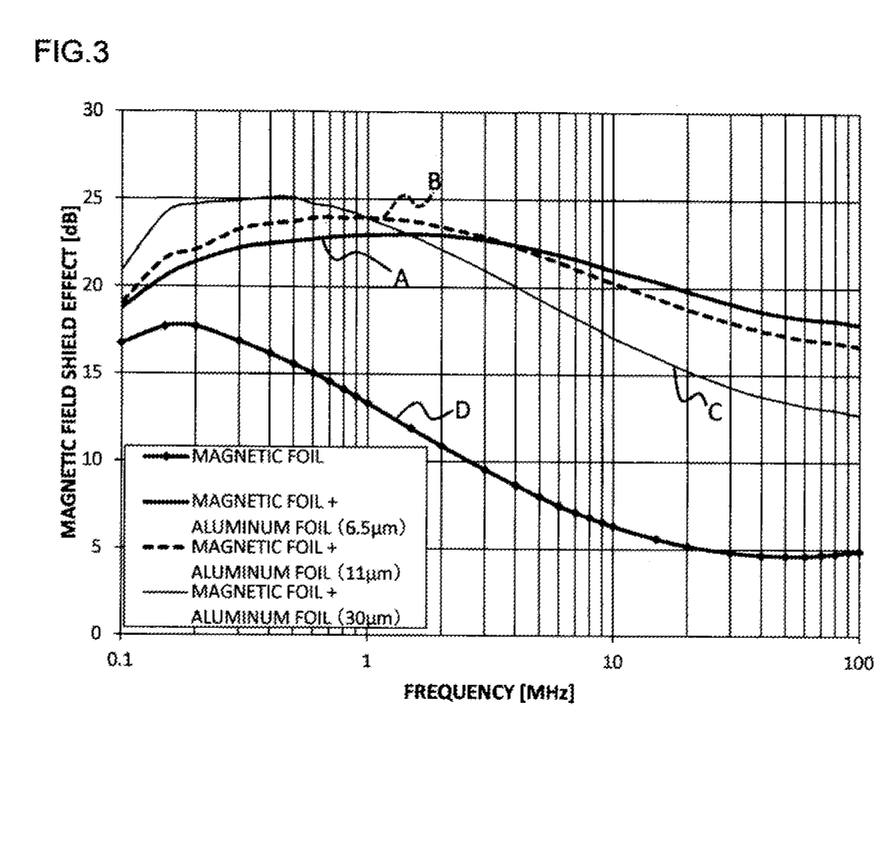
FIG. 3 Graph showing measurement results of magnetic field shield effect in the case where the thicknesses of an aluminum foil of the magnetic shield material shown in FIG. 2 are 6.5 μm, 11 μm and 30 μm, and where no aluminum foil is present.

Curves A, B and C in FIG. 3 are curves showing the measurement results of magnetic field shield effect in the case where the thicknesses of the aluminum foil 13 in the magnetic shield material 1 shown in FIG. 2 are 6.5 μm, 11 μm and 30 μm, respectively. Further, curve D in FIG. 3 is a curve showing the measurement result of magnetic field shield effect in the case where the aluminum foil 13 is removed from the magnetic shield material 1 shown in FIG. 2. The magnetic foil 12 of the magnetic shield material 1 used for these measurements had a thickness of 20 μm and a relative permeability ($\mu/\mu_0$) of about 9,000. Note that among the respective layers forming the magnetic shield material 1 shown in FIG. 2, those that relate to the magnetic field shield performance are only the magnetic foil 12 and the aluminum foil 13. Therefore, also in the case where the magnetic shield material 1 is formed by only the magnetic foil 12 and the aluminum foil 13, and where the thicknesses of the aluminum foil 13 are set at 6.5 μm, 11 μm and 30 μm, it is possible to obtain measurement results of magnetic field shield effect similar to curves A, B and C described above. Further, for a similar reason, the curve of measurement result of magnetic field shield effect of only the magnetic foil 12 is essentially the same as curve D described above.

In the above measurements, a metal foil of a Fe-based nanocrystalline soft magnetic material was used for the magnetic foil 12 of the magnetic shield material 1. As shown in Table 1 below, the composition (weight ratio) of the Fe-based nanocrystalline soft magnetic material was 83 wt % iron (Fe), 9 wt % silicon (Si), 6 wt % niobium (Nb), 1 wt % boron (B) and 1 wt % copper (Cu).

TABLE 1

| Iron Fe | Silicon Si | Niobium Nb | Boron B | Copper Cu |
|---------|------------|------------|---------|-----------|
| 83%     | 9%         | 6%         | 1%      | 1%        |

The measurement system of the KEC method described above can measure magnetic field (or electric field) shield effect of a shield material on electromagnetic waves of various frequencies by changing the frequency from a signal generator. When using the measurement system of the KEC method and observing differences in measured values of magnetic field shield effect of each magnetic shield material 1 in the case of stacking aluminum foils 13 with different thicknesses on the magnetic foil 12, while changing the frequency band of electromagnetic wave to be shielded, the inventor of the present application has found that as shown by curves A, B and C in FIG. 3, the frequency band (of electromagnetic wave) which makes it possible to obtain a maximum magnetic field shield effect differs (shifts) depending on the thickness of the aluminum foil 13 (electrically conductive layer). More specifically, it has been found that if other conditions (in particular, the thickness and relative permeability of the magnetic foil 12 in the magnetic shield material 1) are the same, then as shown by curves A, B and C in FIG. 3, the frequency (of electromagnetic wave) which enables (the magnetic shield material 1) to have a maximum magnetic field shield effect shifts to a lower frequency as the thickness of the aluminum foil 13 increases.

Further, based on the finding described above, the inventor of the present application has arrived at a technical concept to maximize the magnetic field shield effect of the magnetic shield material 1 in each frequency band of electromagnetic wave by changing the thickness of the aluminum foil 13 depending on the frequency band of electromagnetic wave to be shielded. Note that in the following description, the frequency (of electromagnetic wave) which enables the magnetic shield material 1 using the aluminum foil 13 with a specific thickness to have a maximum magnetic field shield effect will be referred to as "peak value frequency" (of the magnetic shield material 1 using the aluminum foil 13 with the specific thickness).

Note that it is difficult for the KEC method described above to measure the shield effect on electromagnetic wave with a frequency of 0.3 MHz or lower, and therefore, the thicknesses of the respective aluminum foils 13 in the magnetic shield material 1 in the measurements shown in FIG. 3 did not include a thickness (for example, 50 μm) which is considered to cause the peak value frequency described above to be 0.3 MHz or lower.

Figure 4:
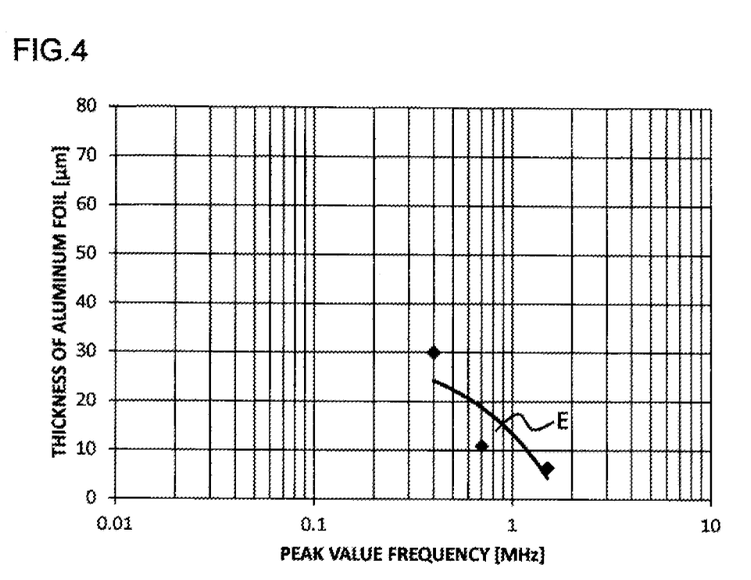
FIG. 4 Graph showing change in peak value frequency in the case where the thickness of the aluminum foil in the magnetic shield material shown in FIG. 2 is changed.

FIG. 4 is a graph showing change in the peak value frequency described above where the thickness of the aluminum foil 13 in the magnetic shield material 1 shown in FIG. 2 is changed. In other words, FIG. 4 is a graph showing a correspondence relationship (combination) between the thickness of the aluminum foil 13 and the peak value frequency of the magnetic shield material 1 using the aluminum foil 13 with such thickness. In FIG. 4, like curves A, B and C shown in FIG. 3, only the peak value frequencies where the thicknesses of the aluminum foil 13 are 6.5 μm, 11 μm and 30 μm are plotted. However, curve E of approximate line shown in FIG. 4 is actually obtained by using a lot of measured data for combinations of the thicknesses of the aluminum foil 13 and the peak value frequencies.

The thickness of the aluminum foil 13 (electrically conductive layer 3) when the intermediate value (average value) of the frequency band of electromagnetic wave to be shielded is equal to the peak value frequency described above is obtained from curve E of approximate line described above, and then the thickness of the aluminum foil 13 in the magnetic shield material 1 is set as the thickness thus obtained from curve E described above. This enables the aluminum foil 13 to have a thickness corresponding to the frequency band of electromagnetic wave to be shielded.

(Influence of Difference in Placement of Magnetic Shield Material Relative to Electromagnetic Wave Generation Source on Magnetic Field Shield Effect)

Figure 5:
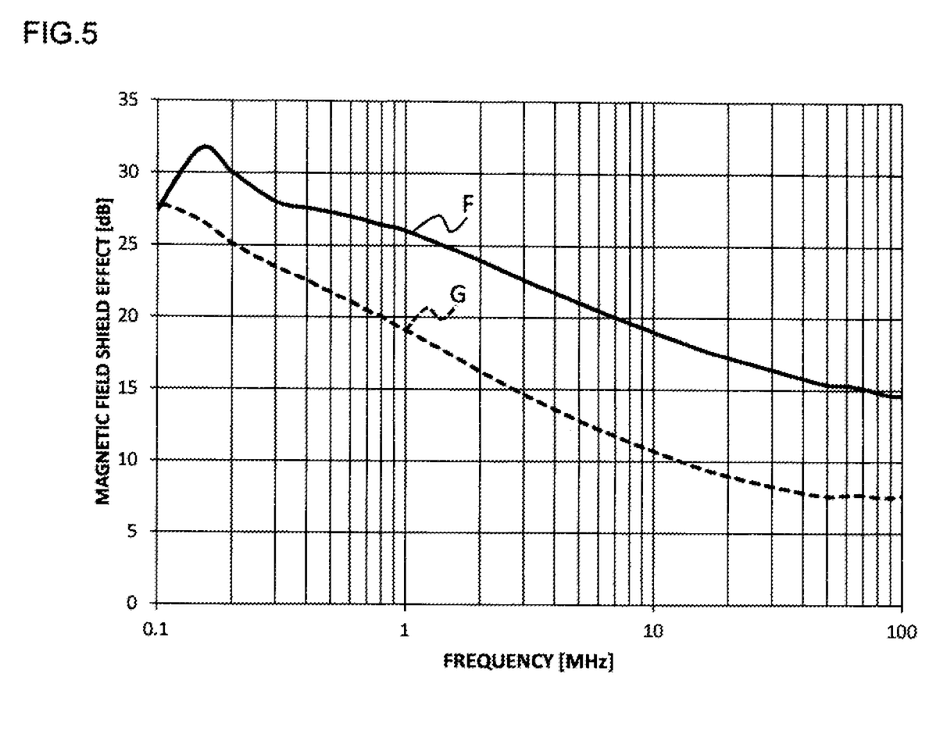
FIG. 5 Graph showing measurement results of magnetic field shield effect in the case where the magnetic shield material is placed relative to an electromagnetic wave generation source as shown in FIG. 2 and as shown in FIG. 6.
Figure 6:
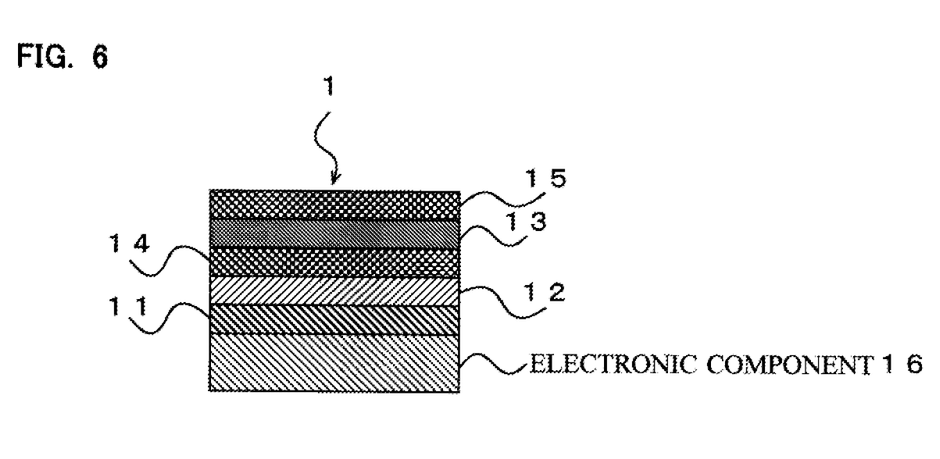
FIG. 6 Cross-sectional view of the magnetic shield material and the electronic component in the case where the magnetic shield material of FIG. 2 is turned upside down and placed on the electromagnetic component.

Next, referring to FIG. 5 and FIG. 6, the influence of difference in the placement of the magnetic shield material 1 relative to the electromagnetic wave generation source on the magnetic field shield effect will be described. In FIG. 6, the magnetic shield material 1 shown in FIG. 2 is turned upside down, in which the double-sided adhesive tape 15, the aluminum foil 13, the double-sided adhesive tape 14, the magnetic foil 12 and the PET film 11 are stacked in order from top to bottom. Curve F shown by the solid line in FIG. 5 is a curve of measurement result of the magnetic field shield effect when, as shown in FIG. 2, the aluminum foil 13 (electrically conductive layer) is placed on the electronic component 16, and further thereon the magnetic foil 12 (magnetic layer) is placed. Further, curve G shown by the dashed line in FIG. 5 is a curve of measurement result of the magnetic field shield effect when, as shown in FIG. 6, the magnetic foil 12 is placed on the electronic component 16, and further thereon the aluminum foil 13 is placed. In these measurements, the aluminum foil 13 with a thickness of 50 μm was used. As understood from the curves in FIG. 5, it is possible for the magnetic shield material 1 to have a more significant magnetic field shield effect in the case where the electrically conductive layer (aluminum foil 13) is placed on the electromagnetic wave generation source (electronic component 16), and further thereon the magnetic layer (magnetic foil 12) is placed as shown in FIG. 2, than in the case where the magnetic layer (magnetic foil 12) is placed on the electromagnetic wave generation source (electronic component 16), and further thereon the electrically conductive layer (aluminum foil 13) is placed as shown in FIG. 6.

As descried above, according to the magnetic shield material 1 of the present embodiment, the aluminum foil 13 (electrically conductive layer 3) is designed to have a thickness corresponding to the frequency band of electromagnetic wave to be shielded. Here, in the magnetic shield material 1, like the magnetic shield material 1 of the present embodiment, which comprises (has stacked) the magnetic layer 2 containing a magnetic material and the electrically conductive layer 3 containing an electrically conductive material, the thickness of the electrically conductive layer 3 to maximize the magnetic field shield effect differs depending on the frequency band of electromagnetic wave to be shielded. Thus, as described above, by designing the electrically conductive layer 3 (aluminum foil 13) to have a thickness corresponding to the frequency band of electromagnetic wave to be shielded (by changing the thickness of the electrically conductive layer 3 (aluminum foil 13) depending on the frequency band of electromagnetic wave to be shielded), it becomes possible to obtain good magnetic field shield effect in the frequency band of electromagnetic wave to be shielded.

Further, according to the magnetic shield material 1 of the present embodiment, the thickness of the electrically conductive layer 3 (aluminum foil 13) is designed to have a thickness to maximize the magnetic field shield effect of the magnetic shield material 1 in the frequency band of electromagnetic wave to be shielded. This makes it possible to maximize the magnetic field shield effect of the magnetic shield material 1 in the frequency band of electromagnetic wave to be shielded.

Further, in the example of using the magnetic shield material 1 of the present embodiment as shown in FIG. 2, the aluminum foil 13 with high electrical conductivity is used for the electrically conductive layer 3, and therefore, the electromagnetic wave shield capability of the magnetic shield material 1 can be increased.

Further, in the magnetic shield material 1 of the present embodiment, a soft magnetic material (including Fe-based nanocrystalline soft magnetic material) with low coercive force and high relative permeability is used as the magnetic material of the magnetic layer 2, and therefore, the magnetic field shield effect of the magnetic shield material 1 can be increased.

MODIFIED EXAMPLES

It is to be noted that the present invention is not limited to the embodiment described above, and various modifications are possible within the spirit and scope of the present invention. Next, modified examples of the present invention will be described.

Modified Example 1

The above embodiment has shown an example where the thickness of the electrically conductive layer 3 (aluminum foil 13) is a thickness to maximize the magnetic field shield effect of the magnetic shield material 1 in a frequency band of electromagnetic wave to be shielded. However, the thickness of the electrically conductive layer is not limited to this, and it is sufficient if it is a thickness corresponding to the frequency band of electromagnetic wave to be shielded (thickness to increase the magnetic field shield effect of the magnetic shield material 1 in the frequency band of electromagnetic wave to be shielded).

Modified Example 2

The above embodiment has shown an example in FIG. 1 where the magnetic shield material 1 is formed by the magnetic layer 2 and the electrically conductive layer 3, and an example in FIG. 2 where the magnetic shield material 1 is formed by the PET film 11, the magnetic layer (magnetic foil 12), the double-sided adhesive tapes 14, 15 and the electrically conductive layer (aluminum foil 13). However, the structure of the magnetic shield material of the present invention is not limited to this, and it is sufficient if it is a structure comprising a magnetic layer containing a magnetic material and an electrically conductive layer containing an electrically conductive material.

DESCRIPTION OF THE REFERENCE NUMERALS

1 Magnetic shield material
2 Magnetic layer
3 Electrically conductive layer
12 Magnetic foil (magnetic layer)
13 Aluminum foil (electrically conductive layer)

The invention claimed is:

1. A magnetic shield material comprising:
a magnetic layer containing a magnetic material; and
an electrically conductive layer containing an electrically conductive material,
wherein the electrically conductive layer is single-layered, and has a thickness determined to maximize magnetic field shield effect corresponding to a thickness of the magnetic layer and a frequency band of electromagnetic wave to be shielded.

2. The magnetic shield material according to claim 1,
wherein the magnetic shield material is arranged to prevent electromagnetic waves emitted by a source of the electromagnetic waves from spreading to outside.

3. The magnetic shield material according to claim 2,
wherein the magnetic shield material is used in such a manner that the electrically conductive layer faces the source of the electromagnetic waves, and the magnetic layer faces the source of the electromagnetic waves through the electrically conductive layer.

4. The magnetic shield material according to claim 1,
wherein the electrically conductive material is aluminum.

5. The magnetic shield material according to claim 1,
wherein the electrically conductive layer is a sheet metal including a metal foil.

6. The magnetic shield material according to claim 1,
wherein the magnetic material is a soft magnetic material.

7. The magnetic shield material according to claim 6,
wherein the magnetic material is an amorphous metal.

8. The magnetic shield material according to claim 1,
wherein the magnetic layer is a sheet metal including a metal foil.

* * * * *